United States Patent
Cao et al.

(10) Patent No.: US 10,208,769 B2
(45) Date of Patent: Feb. 19, 2019

(54) COOLING RACK FAN MODULE AND METHOD OF COOLING

(71) Applicant: SCHNEIDER ELECTRIC IT CORPORATION, West Kingston, RI (US)

(72) Inventors: Qian Cao, Shanghai (CN); Rong Long, Shanghai (CN); Pan Gao, Shanghai (CN); Xuxiang Zhang, Shanghai (CN); Qiang Li, Jiangsu (CN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 482 days.

(21) Appl. No.: 14/899,265

(22) PCT Filed: Jun. 28, 2013

(86) PCT No.: PCT/CN2013/078396
§ 371 (c)(1),
(2) Date: Dec. 17, 2015

(87) PCT Pub. No.: WO2014/205789
PCT Pub. Date: Dec. 31, 2014

(65) Prior Publication Data
US 2016/0146223 A1     May 26, 2016

(51) Int. Cl.
*H05K 7/20*     (2006.01)
*F04D 25/16*     (2006.01)
(Continued)

(52) U.S. Cl.
CPC ......... *F04D 29/664* (2013.01); *F04D 25/166* (2013.01); *F04D 29/522* (2013.01);
(Continued)

(58) Field of Classification Search
CPC .. F04D 29/664; F04D 29/522; F04D 29/5826; F04D 29/601; F04D 29/646;
(Continued)

(56) References Cited

U.S. PATENT DOCUMENTS

| 6,104,608 A | 8/2000 | Casinelli et al. |
| 7,365,973 B2 | 4/2008 | Rasmussen et al. |

(Continued)

FOREIGN PATENT DOCUMENTS

| CN | 101988524 A | 3/2011 |
| CN | 202531490 U | 11/2012 |

(Continued)

OTHER PUBLICATIONS

Extended European Search Report from corresponding European Application No. 13887725.3 dated Feb. 3, 2017.
(Continued)

*Primary Examiner* — Richard A Edgar
(74) *Attorney, Agent, or Firm* — Lando & Anastasi, LLP

(57) ABSTRACT

A fan module for a cooling unit includes a housing configured to be secured within the cooling unit. The housing has a first open end and a second open end spaced from the first open end. The fan module further includes a fan assembly secured within the housing at the first open end of the housing. The fan assembly includes a fan support, a fan rotatably coupled to the fan support, and a motor coupled to the fan to drive rotation of the fan. The fan support is configured to support the fan assembly within the housing. The fan module further comprises a noise reduction assembly disposed in the housing adjacent the fan assembly to reduce noise generated by the fan assembly.

15 Claims, 8 Drawing Sheets

(51) Int. Cl.
*F04D 29/52* (2006.01)
*F04D 29/58* (2006.01)
*F04D 29/60* (2006.01)
*F04D 29/64* (2006.01)
*F04D 29/66* (2006.01)
*F04D 29/70* (2006.01)

(52) U.S. Cl.
CPC ....... *F04D 29/5826* (2013.01); *F04D 29/601* (2013.01); *F04D 29/646* (2013.01); *H05K 7/20172* (2013.01); *H05K 7/20827* (2013.01); *F04D 29/703* (2013.01)

(58) Field of Classification Search
CPC . F04D 29/703; F04D 25/166; H05K 7/20172; H05K 7/20827
See application file for complete search history.

(56) References Cited

U.S. PATENT DOCUMENTS

| | | | | |
|---|---|---|---|---|
| 7,779,960 | B2* | 8/2010 | Tang | ................ H05K 7/20727 181/224 |
| 8,327,656 | B2 | 12/2012 | Tutunoglu et al. | |
| 8,672,732 | B2 | 3/2014 | Rasmussen et al. | |
| 2006/0131101 | A1* | 6/2006 | Crocker | ................ F04D 29/664 181/224 |
| 2007/0163748 | A1 | 7/2007 | Rasmussen et al. | |
| 2010/0040456 | A1 | 2/2010 | Hwang et al. | |

FOREIGN PATENT DOCUMENTS

| | | |
|---|---|---|
| DE | 2322251 A1 | 11/1974 |
| GB | 984817 A | 3/1965 |
| JP | H08303397 A | 11/1996 |
| JP | 2001153098 A | 6/2001 |
| JP | 2005090789 A | 4/2005 |
| JP | 2006170045 A | 6/2006 |
| JP | 2011169295 A | 9/2011 |
| WO | 2006066178 A1 | 6/2006 |
| WO | 2008019038 A1 | 2/2008 |

OTHER PUBLICATIONS

International Search Report from corresponding PCT/CN2013/078396 dated Mar. 27, 2014.

\* cited by examiner

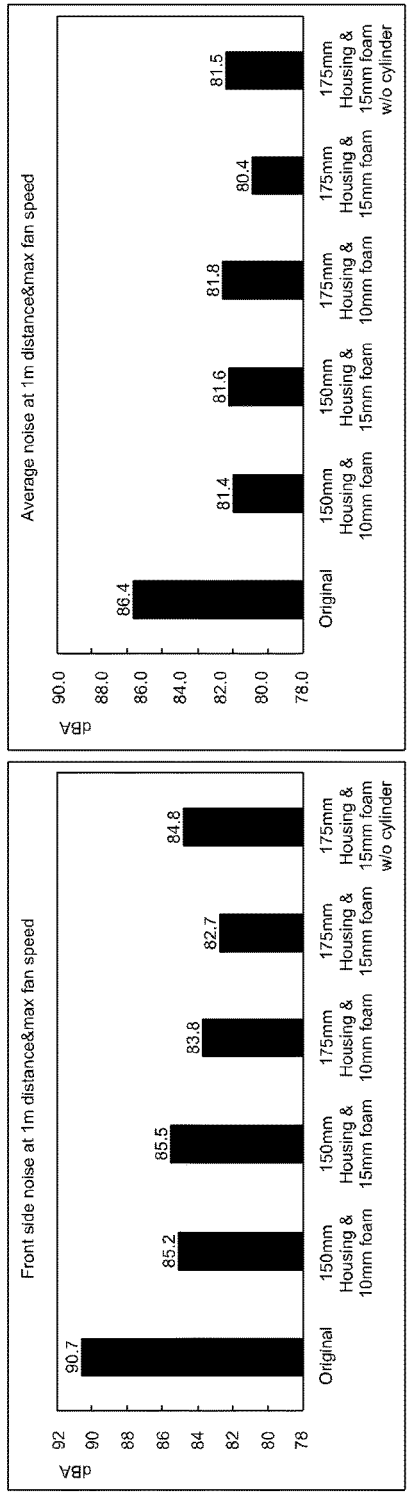
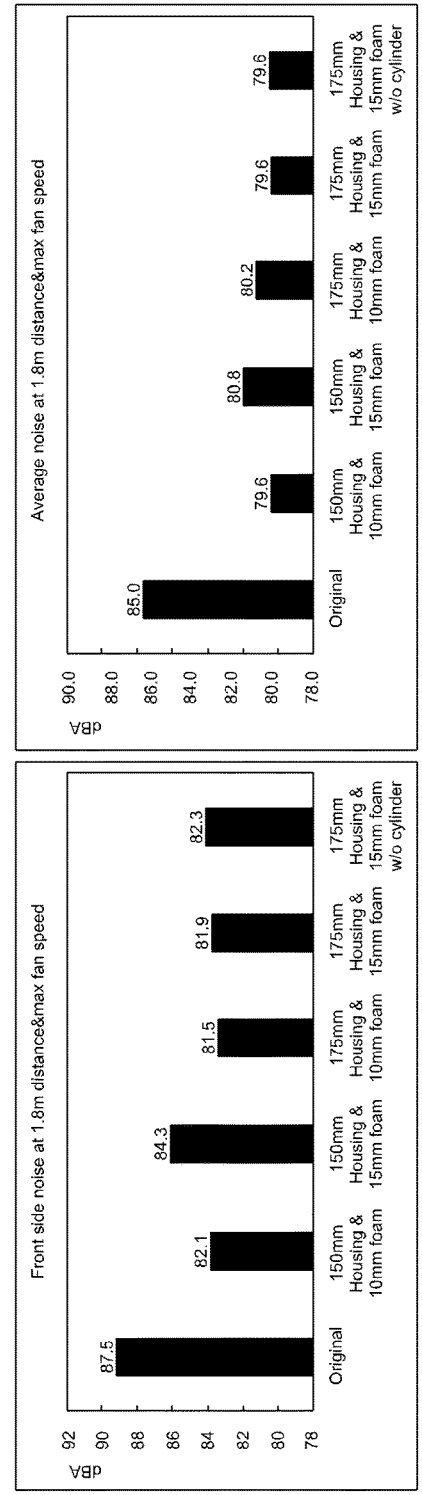
FIG. 11A
FIG. 11B
FIG. 11C
FIG. 11D

COOLING RACK FAN MODULE AND METHOD OF COOLING

CROSS-REFERENCE TO RELATED APPLICATIONS

This application is a U.S. National Stage Application under 35 U.S.C. § 371 of International Application No. PCT/CN2013/078396, filed Jun. 28, 2013, titled COOLING RACK FAN MODULE AND METHOD OF COOLING, which is hereby incorporated herein by reference in its entirety.

BACKGROUND

1. Field of Disclosure

The present disclosure relates generally to the cooling systems used in a data center environment, and more particularly to a cooling rack fan module and related methods of cooling the data center.

2. Discussion of Related Art

Equipment enclosures or racks for housing electronic equipment, such as data processing, networking and telecommunications equipment have been used for many years. Such racks are used to contain and to arrange the equipment in large data centers, as well as small wiring closets and equipment rooms. In certain embodiments, an equipment rack can be an open configuration and can be housed within a rack enclosure, although the enclosure may be included when referring to a rack. A standard rack typically includes front mounting rails to which multiple units of electronic equipment, such as servers, CPUs and telecommunication equipment, are mounted and stacked vertically within the rack. With the proliferation of the Internet, it is not uncommon for a data center to contain hundreds of these racks. Further, with the ever decreasing size of computer equipment, and in particular, computer servers and blades, the number of electrical devices mounted in each rack has been increasing, raising concerns about adequately cooling the equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Previously, in certain configurations, data centers have been cooled by computer room air conditioner ("CRAC") units that are positioned around the periphery of the data center room. These CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks. The rack-mounted equipment typically cools itself by drawing air along a front side or air inlet side of a rack, drawing the air through its components, and subsequently exhausting the air from a rear or vent side of the rack.

Examples of cooling units that may be configured to be placed within a data center may be made to: U.S. patent application Ser. No. 11/335,874, entitled COOLING SYSTEM AND METHOD, by Neil Rasmussen, John Bean, Greg Uhrhan and Scott Buell, filed on Jan. 19, 2006; U.S. Pat. No. 7,365,973, entitled COOLING SYSTEM AND METHOD, by Neil Rasmussen, John H. Bean, Greg R. Uhrhan and Scott D. Buell, issued on Apr. 29, 2008; and U.S. patent application Ser. No. 11/335,901, entitled COOLING SYSTEM AND METHOD, by Neil Rasmussen, John Bean, Vincent Long, Greg Uhrhan and Matthew Brown, filed on Jan. 19, 2006, all of which are incorporated herein by reference in their entirety for all purposes. Other examples of cooling units may be found in U.S. patent application Ser. No. 11/504,382, entitled METHOD AND APPARATUS FOR COOLING, by Ozan Tutunoglu, filed on Aug. 15, 2006, abandoned, and U.S. patent application Ser. No. 11/504,370, entitled METHOD AND APPARATUS FOR COOLING, by Ozan Tutunoglu and David Lingrey, filed on Aug. 15, 2006, 2006, both of which are incorporated herein by reference in their entirety for all purposes.

There is a continuous need to improve the performance of the cooling unit, including increasing energy efficiency and air flow rate. FIG. 1 illustrates a prior art cooling unit 10. One issue associated with such cooling units is that they are noisy. FIG. 2 illustrates a prior art fan module 20 having a fan bezel 22, a fan assembly 24, and a finger guard 26. When all eight fan modules 20 of the cooling unit 10 are operating at maximum fan speed, the noise may reach 90 decibels (dB) in front of cooling unit, at a distance of one meter from the cooling unit.

Other equipment having fans that are used within the data center, such as ventilation fans, is also noisy. To meet high air flow requirement, the fan speeds of the fans may reach 6500 revolutions per minute (RPM). When all of the fan modules within a particular cooling unit are running at maximum speed, the sound level is too high. Reducing the noise level presents several challenges. One challenge is that a cooling unit having a 300 mm width is too small to use traditional sound attenuation solution, such as a static pressure chamber and/or sound isolation. Another challenge is that the air flow requirement is very high, and any sound solution must balance the air flow reduction and sound attenuation effects.

SUMMARY OF DISCLOSURE

One aspect of the present disclosure is directed to a fan module for a cooling unit. In one embodiment, the fan module comprises a housing configured to be secured within the cooling unit. The housing has a first open end and a second open end spaced from the first open end. The fan module further comprises a fan assembly secured within the housing at the first open end of the housing. The fan assembly includes a fan support, a fan rotatably coupled to the fan support, and a motor coupled to the fan to drive rotation of the fan. The fan support is configured to support the fan assembly within the housing. The fan module further comprises a noise reduction assembly disposed in the housing adjacent the fan assembly to reduce noise generated by the fan assembly.

Embodiments of the fan module may include one or more of the following features. The noise reduction assembly may include a holder configured to be secured to one of the fan support and the housing, and an acoustic component secured to the holder. The acoustic component may include a foam cylinder that extends from the holder towards the second open end of the housing. The foam cylinder may be centrally positioned within the housing so that it is coaxial with the fan of the fan assembly. The fan module further may comprise a foam liner secured to an interior surface of the housing. The holder may include a plate and rod extending from the plate, the rod being configured to support the acoustic component. The fan module further may comprise a first guard secured to the first end of the housing to prevent access to the fan assembly. The fan module further may comprise a second guard secured to the second end of the housing. The fan module further may comprise a duct cover secured to the second end of the housing inboard from the second guard.

Another aspect of the present disclosure is directed to a method of cooling comprising: disposing a fan module within a cooling unit, the fan module being configured to draw air into the cooling unit; and moving air over a noise reduction assembly disposed in a housing of the fan module to reduce noise generated by the fan assembly.

An additional aspect of the present disclosure is directed to a cooling unit comprising a housing, a heat exchanger supported by the housing, and a plurality of fan modules supported by the housing and configured to draw air into the housing and through the heat exchanger. Each fan module comprises a housing configured to be secured within the cooling unit, the housing having a first open end and a second open end spaced from the first open end, a fan assembly secured within the housing at the first open end of the housing, the fan assembly including a fan support, a fan rotatably coupled to the fan support, and a motor coupled to the fan to drive rotation of the fan, the fan support being to support the fan assembly within the housing, and a noise reduction assembly disposed in the housing adjacent the fan assembly to reduce noise generated by the fan assembly.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures:

FIGS. 11A-11D are graphs showing the test results illustrated in FIG. 10;

DETAILED DESCRIPTION

Figure 1:
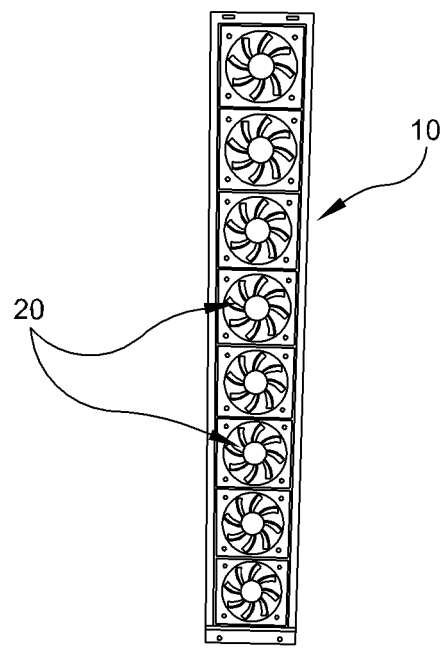
FIG. 1 is a front view of a prior art cooling unit.
Figure 2:
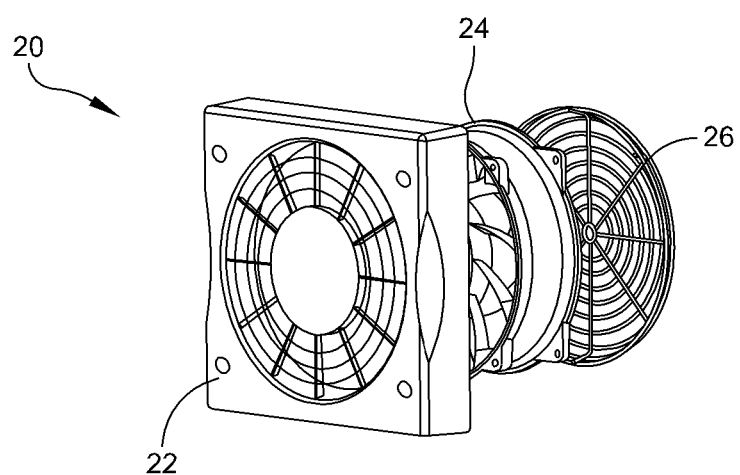
FIG. 2 is an exploded perspective view of a prior art fan module.

At least one embodiment of the present disclosure is directed a fan module that is used in a cooling unit that is selectively positionable to cool electronic equipment housed within equipment enclosures or racks of a data center. As used herein, "enclosures" and "racks" are used to describe apparatus designed to support electronic equipment. Such a cooling system is capable of employing one or more cooling units on an as needed basis to provide localized cooling within the data center. Specifically, multiple cooling units may be interspersed in a row of equipment racks to more efficiently cool the data center. The circulation path of warm air generated by the electronic equipment is greatly reduced, thereby nearly eliminating the mixing of hot and cold air within the data center.

Data centers are typically large rooms designed, in certain instances, to house hundreds of electronic equipment racks arranged in rows within the data center. The rows of equipment racks are arranged in such a manner that there are cold aisles and hot aisles. The cold aisles provide access to the fronts of the enclosures where the electronic equipment is typically accessed. The hot aisles provide access to the backs of the equipment racks. As requirements change, the number of equipment racks may be increased or decreased depending on the functional requirements of the data center. At least one embodiment of the cooling unit of the present disclosure is modular and scalable. Also, although relatively large data centers are discussed as an intended use for such a cooling system incorporating cooling units, as mentioned above, the cooling units of the present disclosure may be employed in smaller rooms on a smaller scale.

In one embodiment, each cooling unit has a housing that is configured to support components of the cooling system within the housing. For example, the components of the cooling unit may include a heat exchanger embodying an evaporator that is coupled to a source of liquid refrigerant. The evaporator is connected to the source so that liquid refrigerant is delivered to the evaporator and vaporized refrigerant is returned to the source. The cooling unit may further include one or more fan modules at the front or the rear of the cooling unit to move air across the heat exchanger. As discussed above, the cooling unit may be disposed within a row of equipment racks and configured to intake the hot air within the data center from a hot aisle, for example, to cool the air to slightly below ambient temperature. This configuration eliminates the inefficiency of mixing hot air with the room temperature air to obtain a warm mixture.

In certain embodiments, the cooling unit may be one-half the width of a standard size nineteen inch equipment rack, e.g., twelve inches in width, and may be modular so that the cooling unit may be inserted into a row of equipment racks in a matter of minutes by data center employees who have no particular heating and cooling training or specialization. The modular nature of the cooling system allows the user to optimize the location of each cooling unit. Thus, the cooling system may be employed and redeployed for maximum efficiency and use within the data center.

Figure 3:
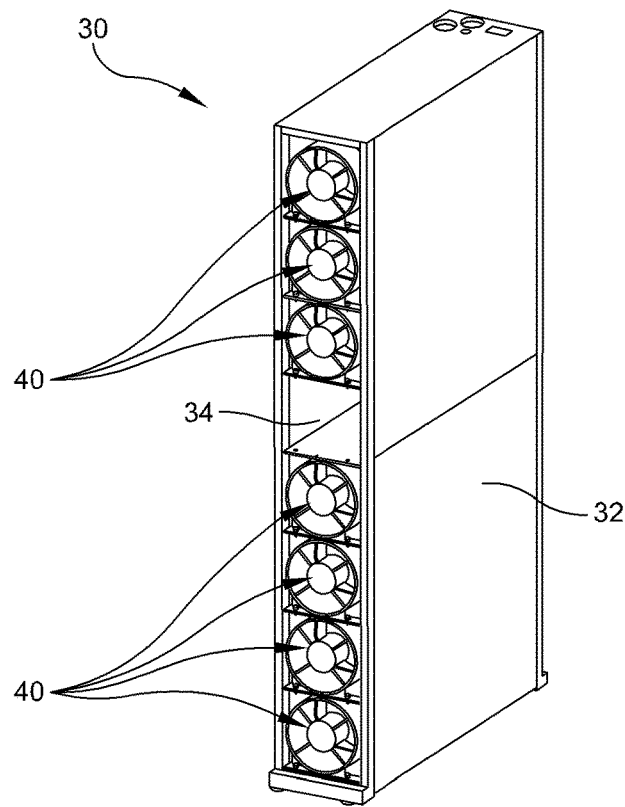
FIG. 3 is a front perspective view of a cooling unit having fan modules of an embodiment of the present disclosure.
Figure 4:
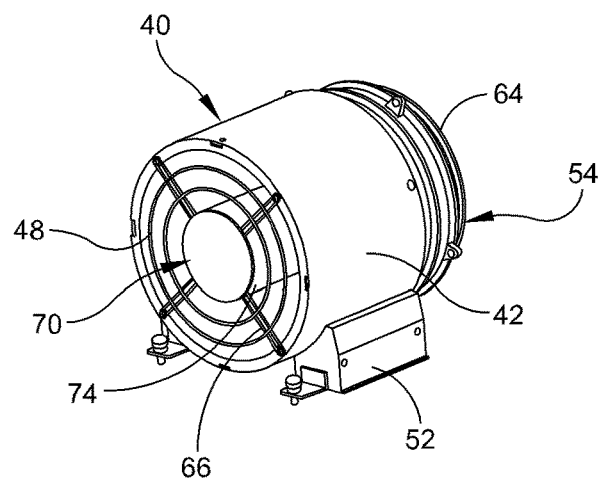
FIG. 4 is a front perspective view of a fan module shown in FIG. 3.
Figure 5:
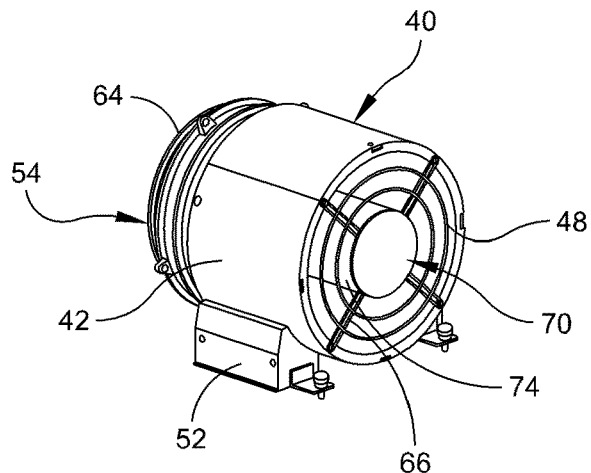
FIG. 5 is a front perspective view of the fan module taken from the other side of the fan module.
Figure 6:
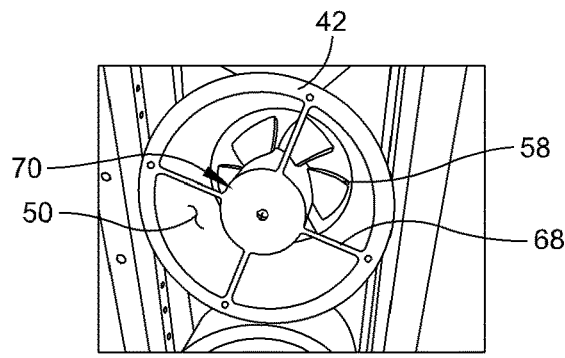
FIG. 6 is a front view of the fan module.
Figure 7:
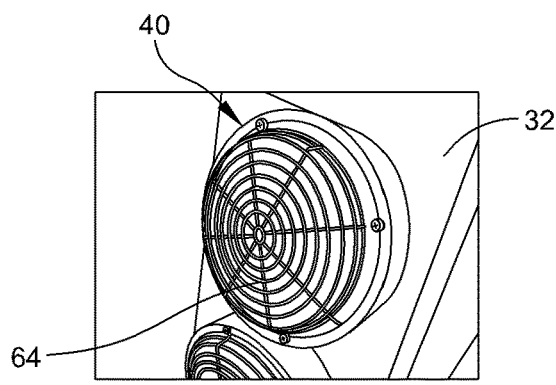
FIG. 7 is a back view of the fan module.

Turning now to FIG. 3, in order to address the heat build-up and hot spots within the data center, and to address climate control issues within the data center in general, a cooling unit, generally indicated at 30, is provided. In one embodiment, the cooling unit 30 includes a housing 32 that may be constructed similarly to a housing of an equipment rack. Like an equipment rack, the housing 32 of the cooling unit 30 is a rectangular structure having a front, a back, two sides, a bottom and a top defined by a frame constructed of vertical and horizontal support members. Covers or panels are provided to cover the front, back, sides and top. As will be disclosed in greater detail below, the cooling unit 32 is configured to accommodate and house cooling equipment, and, in some embodiments, may be conveniently broken down and disassembled for transport or storage with the aid of hand tools only.

Still referring to FIG. 3, in one embodiment, the housing 32 of the cooling unit 30 has a width that is approximately one-half the width of the equipment rack. As stated above, a standard nineteen inch rack has a width of approximately twenty-four inches. Thus, the width of the housing 32 of the cooling unit 30 is approximately twelve inches. This sizing enables the person configuring the data center to position a cooling unit or multiple cooling units in between equipment racks while being able to maintain equivalent spacing among several rows. The narrower width of the cooling unit 30 also takes up less space, and, coupled with the modular and movable nature of the cooling unit, enables the cooling unit to be conveniently placed between two equipment racks in an easily scalable manner.

The housing 32 of the cooling unit 30 creates a space within an interior region of the cooling unit to allow components of a cooling system to be housed within the cooling unit. In certain embodiments, the front panel and the back panel may be secured to the frame of the housing 32 of the cooling unit 30 by quarter-turn latches to enable easy attachment and removal of the panels so that the interior region may be quickly accessed. As shown, the front of the housing 32 of the cooling unit 30 has a number of fans modules (e.g., eight), each generally indicated at 40, that are adapted to draw air from the back of the cooling unit to the front of the cooling unit. In some embodiments, the air may be passed through one or more filters (not shown) disposed within the interior region of the cooling unit to purify the air. The air may be further passed through one or more heat exchangers to condition the air prior to being discharged from the cooling unit 30.

In one embodiment, the fan modules 40 may be assembled and wired within the housing 32 of the cooling unit such that a fan module 40 is removed by removing fasteners and sliding the fan module out of a receptacle 34 formed in the housing of the cooling unit 30. The electrical power provided to each fan module 40 may be connected and disconnected by a suitable connector, such as a blindmate connector. The arrangement is such that the fan modules 40 are "hot swappable" based on voltage requirements as well as their easy removal from the receptacle 34 and the blindmate connector. In some embodiments, a controller may be configured to monitor the operation of the fan so as to predict the failure of a fan based on power draw variances of the fan. The controller is also configured to control the operation of the other working components of the cooling unit 30. Although the fan modules 40 are shown to be located at the front of the cooling unit 30 illustrated in FIG. 1, the fan modules may alternatively be provided at the back of the cooling unit to blow air into the interior region of the cooling unit.

Referring to FIGS. 4-8, the fan module 40 is generally cylindrical in construction and configured to be inserted into and out of the receptacle 34 of the cooling unit 30 as described above. In a certain embodiment, the fan module 40 includes a fan module housing 42 that is sized to be received within the receptacle 34 of the cooling unit 30 and configured to be secured within the cooling unit. The housing 42 includes a cylindrical body 44 having a first open end 46 and a second open end 48 spaced from the first open end. An interior surface of the housing is lined with a foam liner 50 (FIG. 8), the purpose of which will become apparent as the description of the fan module proceeds. The interior of the housing 42 is sized to receive the working components of the fan module 40. The housing 42 further includes a cover 52 to protect a printed circuit board that is associated with the fan module 40 and controls the operation of the fan module.

Figure 8:
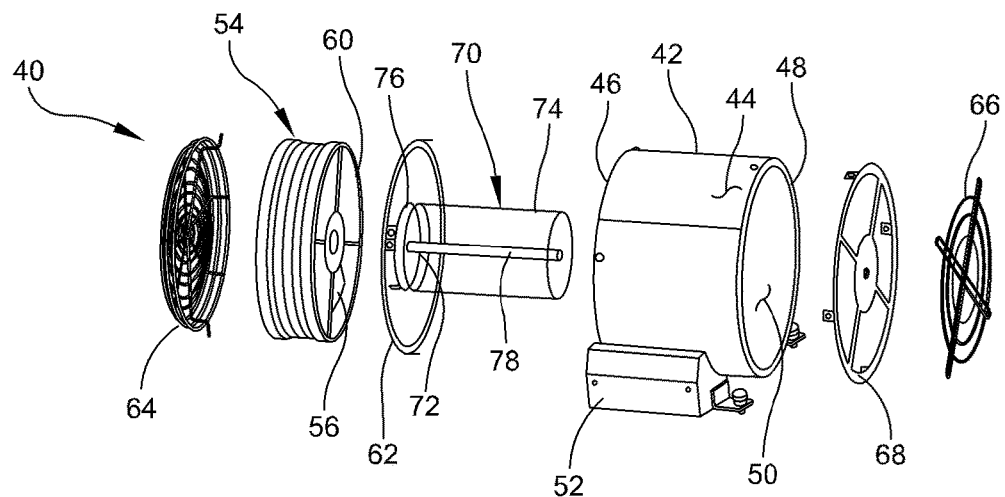
FIG. 8 is an exploded perspective view of the fan module.

Referring to FIG. 8, the fan module 40 further includes a fan assembly, generally indicated at 54, that is secured within the interior of the housing 42 at the open end 46 of the housing. In one embodiment, the fan assembly 54 includes a fan support 56, a fan 58 coupled to the fan support, and a motor 60 coupled to the fan to drive rotation of the fan. A mounting ring 62 is further provided, the purpose of which will be discussed in greater detail below. The fan module 40 further includes a traditional finger guard 64 that is releasably secured to the end of the housing 42 to protect against inadvertent engagement with the fan assembly 54. A guard 66 is secured to the other end of the housing 42, with a duct cover 68 being secured to the other end of the housing inboard from the guard.

The fan module 40 further includes a noise reduction assembly, generally indicated at 70, which is disposed in the housing 42 adjacent the fan assembly 54 to reduce noise generated by the fan assembly. In one embodiment, the noise reduction assembly 70 includes a holder 72 configured to be secured to the housing 42 of the fan module 40. As shown, one end of the holder 72 is secured to the housing 42 and the other end of the holder is secured to the duct cover 68. The noise reduction assembly 70 further includes an acoustic component 74 supported by the holder 72. In a certain embodiment, the acoustic component 74 includes a foam cylinder that extends from the holder 72 towards the open end 48 of the housing 42. As shown, the acoustic component 74 is centrally positioned within the housing 42 so that it is coaxial with the direction of flow of air caused by the fan 58 of the fan assembly 54. The holder 72 includes a plate 76 that is secured to the housing 42 by the mounting ring 62. The holder 72 further includes a rod 78 having one end that is secured to the plate 76 and an opposite end that is secured to the duct cover 68 by a screw fastener. The rod 78 extends from the plate, with the rod being configured to support the acoustic component 74 by extending through the acoustic component.

Figure 9:
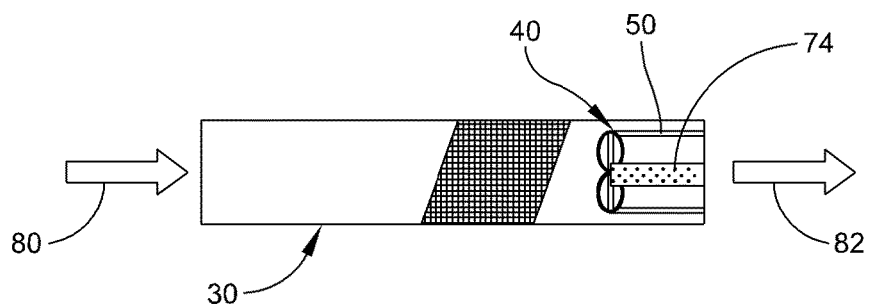
FIG. 9 is a schematic view of airflow through the fan module of the cooling unit.

FIG. 9 illustrates airflow through the fan module 40. As shown, inlet air 80 is introduced into the fan module 40 within the cooling unit 30 through the open end 46 of the housing of the fan module. The air travels through the fan module 40 so that the air travels around the centrally positioned acoustic component 74. Outlet air 82 exits through the other open end 48 of the housing. The combination of the centrally positioned acoustic component 74 fabricated from foam material and the foam liner 50 of the housing 42 significantly reduces noise generated by the fan module 40. In one embodiment, the acoustic component 74 is approximately 80-100 mm in diameter and the inner diameter of the foam liner is approximately 210 mm. Air traveling through the housing 42 of the fan module 40

With prior art cooling units, a cooling unit having eight fan modules operating at a flow rate as high as 4200 cubic feet per minute ("CFM"), when operating all each fan module at a speed of approximately 6500 revolutions per minute (RPM), produces a noise level of about 90 dB taken in front of cooling unit, one meter away from the unit at a height of one meter off a floor upon which the cooling unit rests. In certain circumstances, this noise level may require noise protection. The fan module 40 of embodiments of the present disclosure having the noise reduction assembly 70 reduces the noise level five dBs, while exhibiting no decrease in air flow through the fan module. The noise reduction assembly 70 incorporating foam components, e.g., foam liner 50 and foam cylinder 74 may be applied to other components within the cooling to reduce noise levels generated by the cooling unit 30.

The diameter and length of the foam cylinder 74 and the thickness of the foam liner 50 may be manipulated to optimize the performance of the noise reduction assembly 70 of the fan module 40. This may result, as mentioned above, to a noise reduction of about five dBs, while minimizing the effect of flow rate within the fan module 40 due to the minimal impact of air resistance caused by the noise reduction assembly 70. The fan module 40 may be easily assembled and installed within the cooling unit 30.

A longer length of housing 42, a thicker liner 50, and a larger diameter of foam cylinder 74, while resulting in a lower sound level, also have a lower flow rate at maximum fan speed. To balance the sound reduction level and flow rate, as shown in FIGS. 10 and 11A-11D, the following test items were tested:

prior art fan module without noise reduction;
150 mm length housing and 10 mm thickness foam liner;
150 mm length housing and 15 mm thickness foam liner;
175 mm length housing and 10 mm thickness foam liner;
175 mm length housing and 15 mm thickness foam liner; and
175 mm length housing and 15 mm thickness foam liner without cylinder (e.g., foam cylinder 74).

It should be noted that in one embodiment the diameter of the housing 42 is approximately 210 mm, which is almost a maximum diameter that the unit can accommodate. It should be further noted that in one embodiment the foam cylinder 74 diameter is 80 mm, which is a minimum diameter of the fan motor.

Figure 10:
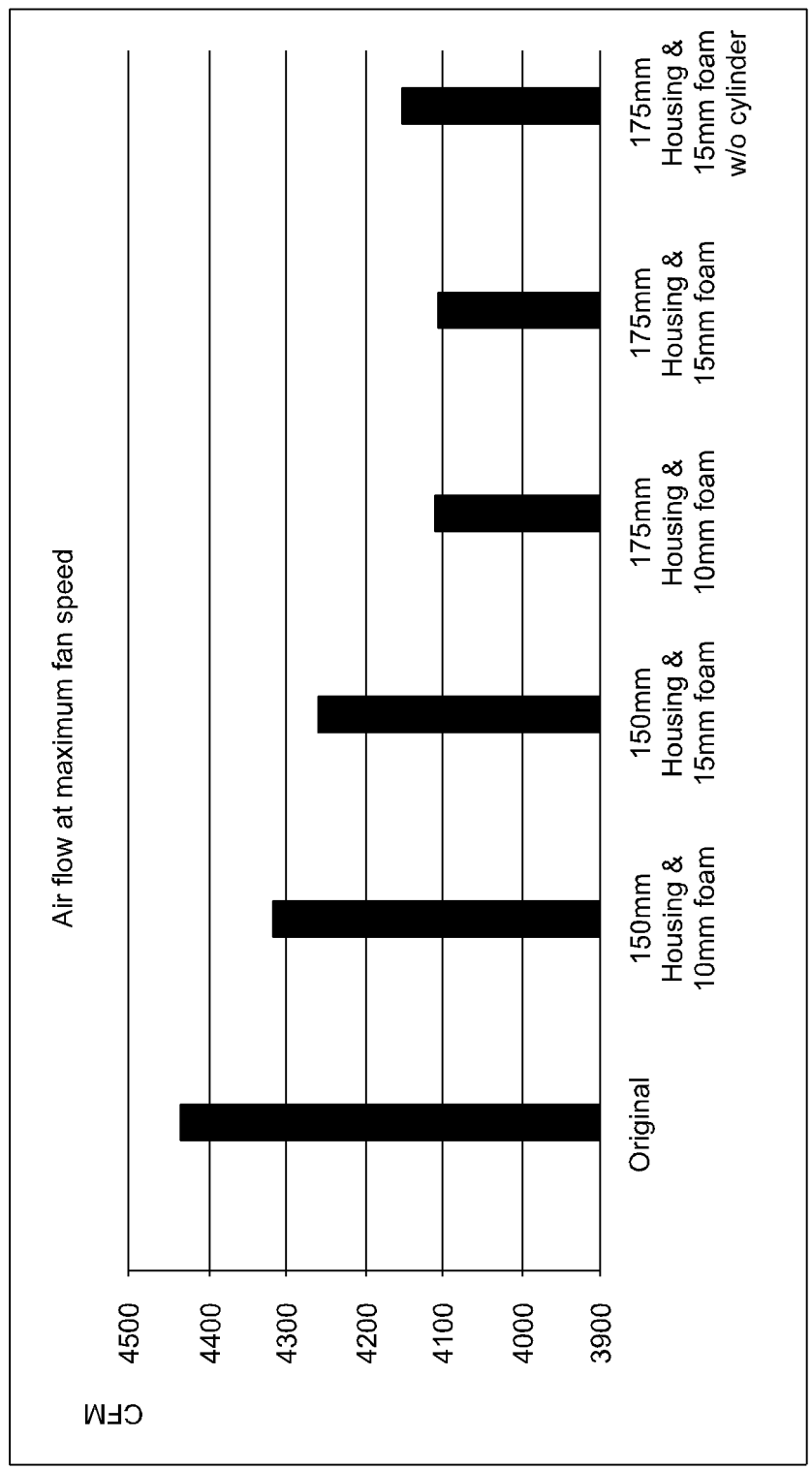
FIG. 10 is a chart showing test results of a prior art fan module and fan modules of embodiments of the present disclosure having center members of varying length.

Referring to FIG. 10, a 175 mm length housing 42 results in a flow rate less than 4200 CFM, which is minimum required flow rate at max fan speed.

Referring to FIGS. 11A and 11B, at one meter height, one meter distance, front side and average sound level reduced more than 5 dB(A) with 150 mm length foam housing 42 and 10 mm thickness foam liner 50. It is also observed that central foam cylinder 74 have sound reduction contribution about 2 dB(A). To have the maximum flow rate and cooling capacity, 10 mm thickness foam liner is acceptable.

Referring to FIGS. 11C and 11D, at one meter height, 1.8 meter distance, front side and average sound level reduced also more than 5 dB(A) with 150 mm length foam housing 42 and 10 mm thickness foam liner 50, and also sound level is less than 85 dB(A).

Finally, when considering noise reduction and flow rate the best results were produced by the 150 mm length foam cylinder housing 42 with the 10 mm thickness foam liner 50, and 80 mm diameter central foam cylinder 74.

It should be observed that the fan module of embodiments of the present disclosure can be easily replaced in a time efficient manner.

Figure 12:
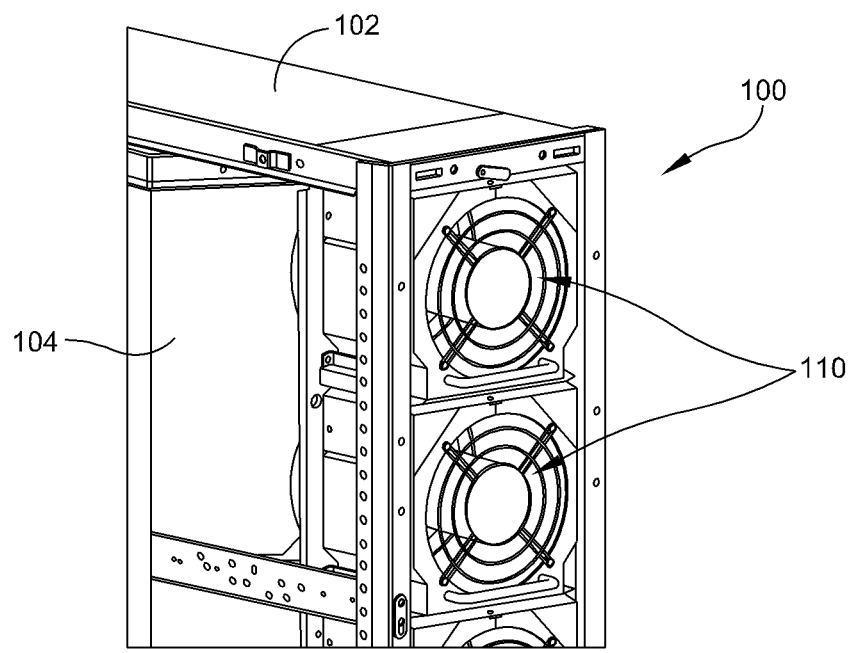
FIG. 12 is a front perspective view of a portion of a cooling unit having fan modules of another embodiment of the present disclosure.

Referring to FIG. 12, a cooling unit of another embodiment is generally indicated at 100. As shown, the cooling unit 100 includes a housing 102, which is similar in construction as cooling unit 30. The front of the housing 102 of the cooling unit 100 has a number of fans modules (e.g., eight), each generally indicated at 110, which are adapted to draw air from the back of the cooling unit to the front of the cooling unit. In some embodiments, the air may be passed through one or more filters (not shown) disposed within the interior region of the cooling unit 100 to purify the air. The fan modules 110 may be assembled and wired within the housing 102 of the cooling unit 100 such that a fan module is removed by removing fasteners and sliding the fan module out of a receptacle formed in the housing of the cooling unit. As with fan module 40, the electrical power provided to each fan module 110 may be connected and disconnected by a suitable connector, such as a blindmate connector. The fan module also supports a heat exchanger 104. As shown, the fan modules 110 are configured to draw air through the heat exchanger 104.

Figure 13:
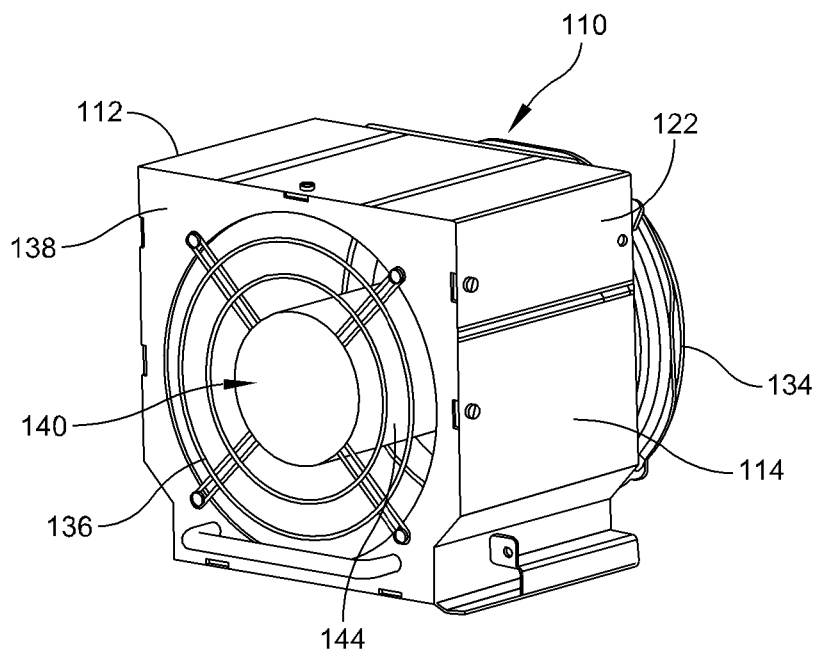
FIG. 13 is a front perspective view of a fan module shown in FIG. 12.
Figure 14:
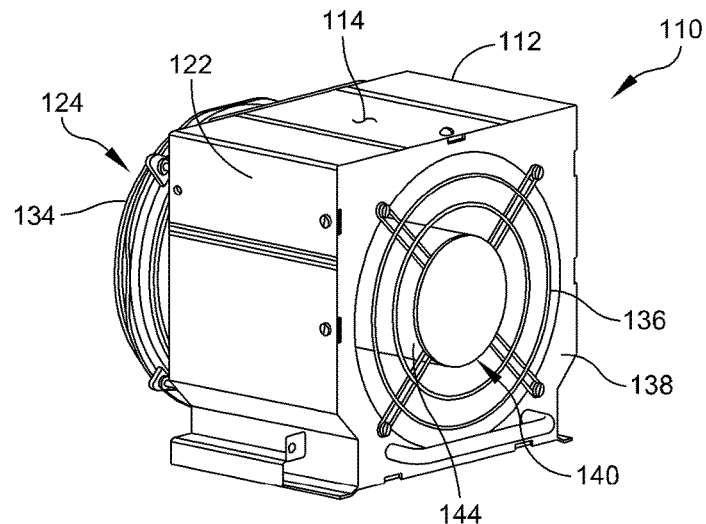
FIG. 14 is a rear perspective view of the fan module.
Figure 15:
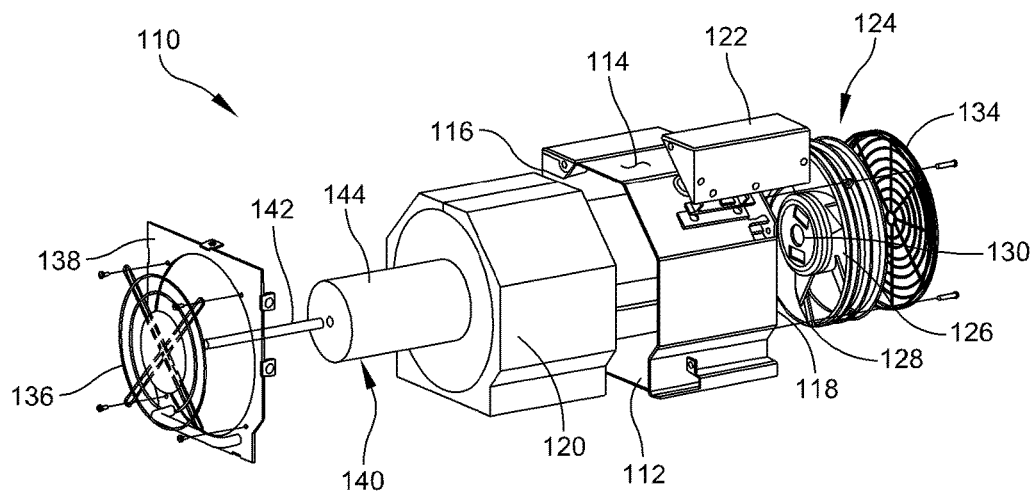
FIG. 15 is an exploded perspective view of the fan module.

Referring to FIGS. 13-15, the fan module 110 is generally rectangular in construction and configured to be inserted into and out of the receptacle of the cooling unit 100. In a certain embodiment, the fan module 110 includes a fan module housing 112 that is sized to be received within the receptacle of the cooling unit 100 and configured to be secured within the cooling unit. The fan module housing 112 includes a rectangular body 114 having a first open end 116 and a second open end 118 spaced from the first open end. An interior surface of the housing is lined with a foam liner 120 (FIG. 16), which has a rectangular body that is shaped to fit within the housing 112. The interior of the housing 112 is sized to receive the working components of the fan module 110. The housing 112 further includes a cover 122 to protect a printed circuit board that is associated with the fan module 110 and controls the operation of the fan module.

Referring to FIG. 15, the fan module 110 further includes a fan assembly, generally indicated at 124, that is secured within the interior of the housing 112 at the open end 116 of the housing. In one embodiment, the fan assembly 124 includes a fan support 126, a fan 128 coupled to the fan support, and a motor 130 coupled to the fan to drive rotation of the fan. The fan module 110 further includes a finger guard 134 that is releasably secured to the end of the housing 112 to protect against inadvertent engagement by an operator with the fan assembly. A guard 136 is secured to the other end 118 of the housing 112, with a duct cover 138 being secured to the other end of the housing inboard from the guard.

The fan module 110 further includes a noise reduction assembly, generally indicated at 140, which is disposed in the housing 112 adjacent the fan assembly 124 to reduce noise generated by the fan assembly. In the shown embodiment, the noise reduction assembly 140 includes a holder 142 configured to be secured to the housing 112 of the fan module 110. Specifically, one end of the holder 142 is secured to the housing 112 and the other end of the holder is secured to the duct cover 138. The noise reduction assembly 140 further includes an acoustic component 144 supported by the holder 142. In a certain embodiment, the acoustic component 144 includes a foam cylinder that extends from the holder 142 towards the open end 118 of the housing 112. As shown, the acoustic component 140 is centrally positioned within the housing 112 so that it is coaxial with the direction of flow of air caused by the fan 128 of the fan assembly 124. The holder 142 includes a rod having one end that is secured to the duct cover 138 by a screw fastener. The rod extends from the duct cover 138, with the rod being configured to support the acoustic component 144 by extending through the acoustic component.

It is to be appreciated that embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A fan module for a cooling unit, the fan module comprising:
    a housing configured to be secured within the cooling unit, the housing having a first open end and a second open end spaced from the first open end;
    a fan assembly secured within the housing at the first open end of the housing, the fan assembly including a fan support, a fan rotatably coupled to the fan support, and a motor coupled to the fan to drive rotation of the fan, the fan support being configured to support the fan assembly within the housing;
    a mounting ring secured to the housing;
    a duct cover secured to housing at the second open end of the housing; and
    a noise reduction assembly disposed in the housing adjacent the fan assembly to reduce noise generated by the fan assembly,
    wherein the noise reduction assembly includes a holder configured to be secured to the housing, and an acoustic component secured to the holder, the holder includes a plate that is secured to the housing by the mounting ring and a rod having one end secured to the plate and an opposite end secured to the duct cover, the rod being configured to support the acoustic component.

2. The fan module of claim 1, wherein the acoustic component includes a foam cylinder that extends from the holder towards the second open end of the housing.

3. The fan module of claim 2, wherein the foam cylinder is centrally positioned within the housing so that it is coaxial with the fan of the fan assembly.

4. The fan module of claim 3, further comprising a foam liner secured to an interior surface of the housing.

5. The fan module of claim 1, further comprising a first guard secured to the first end of the housing to prevent access to the fan assembly.

6. The fan module of claim 5, further comprising a second guard secured to the second end of the housing.

7. The fan module of claim 6, wherein the duct cover is secured to the second end of the housing inboard from the second guard.

8. A method of cooling comprising:
    disposing a fan module within a cooling unit, the fan module being configured to draw air into the cooling unit, the fan module including a housing having a first open end and a second open end spaced from the first open end, a fan assembly having a fan support, a fan rotatably coupled to the fan support, and a motor coupled to the fan to drive rotation of the fan, a mounting ring secured to the housing, a duct cover secured to housing at the second open end of the housing, and a noise reduction assembly disposed in the housing adjacent the fan assembly to reduce noise generated by the fan assembly; and
    moving air over the noise reduction assembly disposed in the housing of the fan module to reduce noise generated by the fan assembly,
    wherein the noise reduction assembly includes a holder configured to be secured to the housing, and an acoustic component secured to the holder, the holder includes a plate that is secured to the housing by the mounting ring and a rod having one end secured to the plate and an opposite end secured to the duct cover, the rod being configured to support the acoustic component.

9. The method of claim 8, wherein the acoustic component includes a foam cylinder that extends from the holder towards the second open end of the housing.

10. The method of claim 9, wherein the foam cylinder is centrally positioned within the housing so that it is coaxial with the fan of the fan assembly.

11. The method of claim 8, wherein the housing includes a foam liner secured to an interior surface of the housing.

12. A cooling unit comprising:
    a housing;
    a heat exchanger supported by the housing; and a plurality of fan modules supported by the housing and configured to draw air into the housing and through the heat exchanger, each fan module comprising
   a fan module housing configured to be secured within the cooling unit, the fan module housing having a first open end and a second open end spaced from the first open end,
   a fan assembly secured within the fan module housing at the first open end of the fan module housing, the fan assembly including a fan support, a fan rotatably coupled to the fan support, and a motor coupled to the fan to drive rotation of the fan, the fan support being to support the fan assembly within the fan module housing,
   a mounting ring secured to the fan module housing,
   a duct cover secured to fan module housing at the second open end of the fan module housing, and
   a noise reduction assembly disposed in the fan module housing adjacent the fan assembly to reduce noise generated by the fan assembly,
   wherein the noise reduction assembly includes a holder configured to be secured to the fan module housing, and an acoustic component secured to the holder, the holder includes a plate that is secured to the housing by the mounting ring and a rod having one end secured to the plate and an opposite end secured to the duct cover, the rod being configured to support the acoustic component.

13. The cooling unit of claim 12, wherein the acoustic component includes a foam cylinder that extends from the holder towards the second open end of the fan module housing.

14. The cooling unit of claim 13, wherein the foam cylinder is centrally positioned within the fan module housing so that it is coaxial with the fan of the fan assembly.

15. The cooling unit of claim 14, wherein the fan module further includes a foam liner secured to an interior surface of the fan module housing.

\* \* \* \* \*